(12) United States Patent
Chang et al.

(10) Patent No.: US 12,426,254 B2
(45) Date of Patent: Sep. 23, 2025

(54) SEMICONDUCTOR STRUCTURE AND MANUFACTURING METHOD THEREOF

(71) Applicant: Powerchip Semiconductor Manufacturing Corporation, Hsinchu (TW)

(72) Inventors: Li-Peng Chang, Hsinchu (TW); San-Jung Chang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 504 days.

(21) Appl. No.: 17/955,565

(22) Filed: Sep. 29, 2022

(65) Prior Publication Data

US 2024/0057318 A1    Feb. 15, 2024

(30) Foreign Application Priority Data

Aug. 11, 2022    (TW) .................................. 111130232

(51) Int. Cl.
*H10B 12/00*    (2023.01)
*H10D 1/00*    (2025.01)
*H10D 1/68*    (2025.01)

(52) U.S. Cl.
CPC ............. *H10B 12/37* (2023.02); *H10D 1/042* (2025.01); *H10D 1/714* (2025.01); *H10D 1/716* (2025.01)

(58) Field of Classification Search
CPC .......... H10D 1/716; H10D 1/68; H10D 1/042; H01L 21/76898; H10B 12/34; H10B 12/37; H10B 12/053; H10B 12/09; H10B 12/50

See application file for complete search history.

(56) References Cited

U.S. PATENT DOCUMENTS 12,342,571 B2 *    6/2025    Tsai ..................... H10D 64/017
2023/0032102 A1 *    2/2023    Mei ........................ H10B 12/34

FOREIGN PATENT DOCUMENTS

| CN | 101826560 | 9/2010 |
| TW | 200943534 | 10/2009 |
| TW | 202133244 | 9/2021 |

OTHER PUBLICATIONS

"Office Action of Taiwan Counterpart Application", issued on May 17, 2023, p. 1-p. 7.

* cited by examiner

*Primary Examiner* — Jose R Diaz
(74) *Attorney, Agent, or Firm* — JCIPRNET

(57) ABSTRACT

A semiconductor structure including a substrate, a first isolation structure and a capacitor is provided. The substrate includes a capacitor region. The first isolation structure is disposed in the substrate in the capacitor region. The capacitor is located in the capacitor region. The capacitor includes the substrate in the capacitor region, an electrode layer and a first dielectric layer. The electrode layer is disposed in the substrate in the capacitor region. The first dielectric layer is disposed between the electrode layer and the substrate and between the electrode layer and the first isolation structure. The first dielectric layer is in direct contact with the first isolation structure.

18 Claims, 15 Drawing Sheets

SEMICONDUCTOR STRUCTURE AND MANUFACTURING METHOD THEREOF

CROSS-REFERENCE TO RELATED APPLICATION

This application claims the priority benefit of Taiwan application serial no. 111130232, filed on Aug. 11, 2022. The entirety of the above-mentioned patent application is hereby incorporated by reference herein and made a part of this specification.

BACKGROUND

Technical Field

The disclosure relates to a semiconductor structure and a manufacturing method thereof, and more particularly, to a semiconductor structure having a capacitor and a manufacturing method thereof.

Description of Related Art

In today's semiconductor industry, capacitors are very important basic components. As an example, a basic design of a common capacitor is to insert an insulating material between electrode plates, so that the two adjacent electrode plates and the insulating material located therebetween form a capacitor unit. However, a current objective to effectively increase a capacitance value per unit area of the capacitor is continuously being sought.

SUMMARY

The disclosure provides a semiconductor structure and a manufacturing method thereof, which effectively increase a capacitance value per unit area of a capacitor.

The disclosure provides a semiconductor structure including a substrate, a first isolation structure and a capacitor. The substrate includes a capacitor region. The first isolation structure is disposed in the substrate in the capacitor region. The capacitor is located in the capacitor region. The capacitor includes the substrate in the capacitor region, an electrode layer and a first dielectric layer. The electrode layer is disposed in the substrate in the capacitor region. The first dielectric layer is disposed between the electrode layer and the substrate and between the electrode layer and the first isolation structure. The first dielectric layer is in direct contact with the first isolation structure.

According to an embodiment of the disclosure, in the above-mentioned semiconductor structure, a groove is formed in the substrate in the capacitor region. The electrode layer and the first dielectric layer are disposed in the groove.

According to an embodiment of the disclosure, in the above-mentioned semiconductor structure, a width of the groove is greater than or equal to a width of the first isolation structure.

According to an embodiment of the disclosure, in the above-mentioned semiconductor structure, the electrode layer includes an upper part and a lower part connected to each other. A width of the upper part is greater than a width of the lower part.

According to an embodiment of the disclosure, in the above-mentioned semiconductor structure, a cross-sectional shape of the electrode layer includes a T-shape.

According to an embodiment of the disclosure, in the above-mentioned semiconductor structure, a top-view shape of the electrode layer includes a grid shape.

According to an embodiment of the disclosure, in the above-mentioned semiconductor structure, the substrate further includes a memory cell region. The semiconductor structure further includes a second isolation structure, a gate electrode and a second dielectric layer. The second isolation structure is disposed in the substrate in the memory cell region. The gate electrode is disposed in the substrate in the memory cell region. The second dielectric layer is disposed between the gate electrode and the substrate and between the gate electrode and the second isolation structure. The second dielectric layer is in direct contact with the second isolation structure.

According to an embodiment of the disclosure, in the above-mentioned semiconductor structure, the second isolation structure defines an active region in the substrate in the memory cell region.

According to an embodiment of the disclosure, in the above-mentioned semiconductor structure, the gate electrode extends over a part of the active region and a part of the second isolation structure.

According to an embodiment of the disclosure, in the above-mentioned semiconductor structure, a depth of the electrode layer is greater than a depth of the gate electrode located directly above the active region.

According to an embodiment of the disclosure, in the above-mentioned semiconductor structure, the depth of the gate electrode located directly above the second isolation structure is greater than the depth of the gate electrode located directly above the active region.

The disclosure provides a manufacturing method of a semiconductor structure, which includes the following. A substrate is provided. The substrate includes a capacitor region. A first isolation structure is formed in the substrate in the capacitor region. A capacitor is formed in the capacitor region. The capacitor includes the substrate in the capacitor region, an electrode layer and a first dielectric layer. The electrode layer is disposed in the substrate in the capacitor region. The first dielectric layer is disposed between the electrode layer and the substrate and between the electrode layer and the first isolation structure. The first dielectric layer is in direct contact with the first isolation structure.

According to an embodiment of the disclosure, in the above-mentioned manufacturing method of the semiconductor structure, the substrate further includes a memory cell region. The manufacturing method of the semiconductor structure further includes the following. A second isolation structure is formed in the substrate in the memory cell region. A gate electrode is formed in the substrate in the memory cell region. A second dielectric layer is formed between the gate electrode and the substrate and between the gate electrode and the second isolation structure. The second dielectric layer is in direct contact with the second isolation structure.

According to an embodiment of the disclosure, in the above-mentioned manufacturing method of the semiconductor structure, the electrode layer and the gate electrode are formed simultaneously.

According to an embodiment of the disclosure, in the above-mentioned manufacturing method of the semiconductor structure, a formation method of the electrode layer, the gate electrode, the first dielectric layer and the second dielectric layer includes the following. A first isolation material layer is formed in the substrate in the capacitor region, and a second isolation material layer is formed in the substrate in the memory cell region. A part of the first isolation material layer is removed, and the first isolation structure and a first groove are formed in the substrate in the capacitor region. The first groove is located directly above the first isolation structure. A part of the second isolation material layer and a part of the substrate in the memory cell region are removed, and the second isolation structure and a second groove are formed in the substrate in the memory cell region. The second isolation structure defines an active region in the substrate in the memory cell region. The second groove extends over a part of the active region and a part of the second isolation structure. A dielectric material layer is formed on the substrate, the first isolation structure, the second isolation structure, a surface of the first groove and a surface of the second groove. A conductive material layer is formed on the dielectric material layer. The conductive material layer fills the first groove and the second groove. The conductive material layer and the dielectric material layer located outside the first groove and outside the second groove are removed to form the electrode layer, the gate electrode, the first dielectric layer and the second dielectric layer.

According to an embodiment of the disclosure, in the above-mentioned manufacturing method of the semiconductor structure, a formation method the first isolation material layer and the second isolation material layer includes performing a shallow trench isolation structure manufacturing process.

According to an embodiment of the disclosure, in the above-mentioned manufacturing method of the semiconductor structure, a formation method the first groove and the second groove includes the following. A patterned photoresist layer is formed on the substrate. The patterned photoresist layer exposes the part of the first isolation material layer. Additionally, the patterned photoresist layer exposes the part of the substrate and the part of the second isolation structure in the memory cell region. Using the patterned photoresist layer as a mask, a dry etching manufacturing process is performed on the first isolation material layer, the second isolation material layer and the substrate in the memory cell region.

According to an embodiment of the disclosure, in the above-mentioned manufacturing method of the semiconductor structure, in the dry etching manufacturing process, an etching rate of a material of the first isolation material layer is greater than an etching rate of a material of the substrate in the memory cell region, so that a depth of the first groove is greater than a depth of the second groove located directly above the active region.

According to an embodiment of the disclosure, in the above-mentioned manufacturing method of the semiconductor structure, in the dry etching manufacturing process, an etching rate of a material of the second isolation material layer is greater than an etching rate of a material of the substrate in the memory cell region, so that a depth of the second groove located directly above the second isolation structure is greater than a depth of the second groove located directly above the active region.

According to an embodiment of the disclosure, the above-mentioned manufacturing method of the semiconductor structure further includes the following. In a process of removing the part of the first isolation material layer, a part of the substrate in the capacitor region is removed, so that a width of the first groove is greater than a width of the first isolation structure.

Based on the above, in the semiconductor structure and the manufacturing method thereof proposed by the disclosure, the electrode layer and the first isolation structure are disposed in the substrate in the capacitor region, the first dielectric layer is disposed between the electrode layer and the substrate and between the electrode layer and the first isolation structure, and the first dielectric layer is in direct contact with the first isolation structure. Therefore, compared with conventional electrode layers, the electrode layer of the capacitor proposed by the disclosure has a greater depth, which increases an area of the electrode layer. Since the electrode layer of the capacitor has a greater area, the capacitance value per unit area of the capacitor is effectively increased. On the other hand, in the manufacturing method of the semiconductor structure proposed by the disclosure, the manufacturing process of the capacitor can be integrated with that of other semiconductor devices (e.g., dynamic random access memory (DRAM) components). In addition, since the manufacturing process of the capacitor can be integrated with that of the other semiconductor devices (e.g., DRAM components), an additional mask is not required without increasing manufacturing costs.

In order to make the above-mentioned features and advantages of the disclosure clearer and easier to understand, the following embodiments are given and described in details with accompanying drawings as follows.

DESCRIPTION OF THE EMBODIMENTS

Figure 1A:
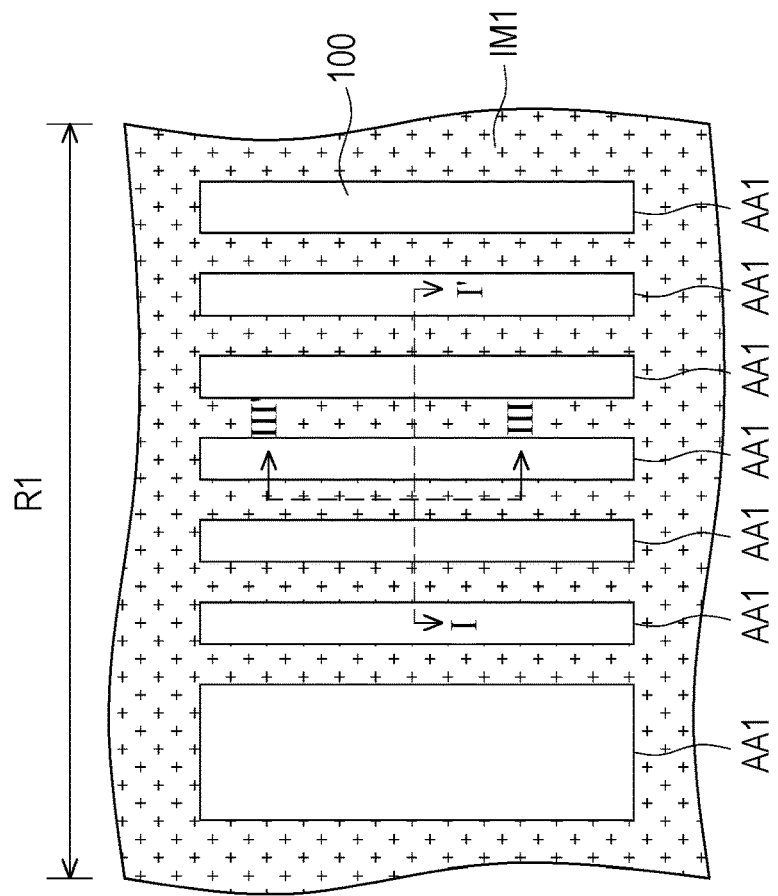
FIGS. 1A to 1E are cross-sectional diagrams of a manufacturing process of a semiconductor structure according to some embodiments of the disclosure.
Figure 1A:
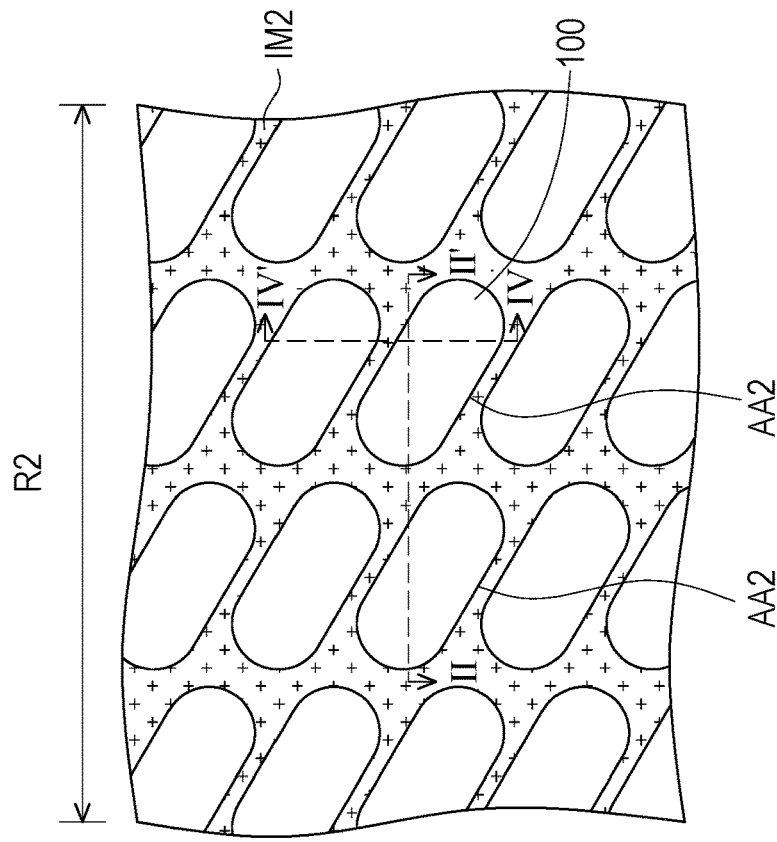

The following embodiments will be described in details with reference to the accompanying drawings, but the embodiments provided are not intended to limit the scope of the disclosure. In order to facilitate understanding, the same elements will be described with reference to the same reference numerals in the following embodiments. In addition, the drawings are for description purposes only and may not be shown to scale. Moreover, features in top-view diagrams are not shown to the same scale as those in cross-sectional diagrams. In fact, for clarity of discussion, sizes of the various features may be arbitrarily enlarged or reduced.

FIGS. 1A to 1E are cross-sectional diagrams of a manufacturing process of a semiconductor structure according to some embodiments of the disclosure. FIGS. 2A to 2E are cross-sectional diagrams of FIGS. 1A to 1E taken along I-I' cross-sectional lines and II-II' cross-sectional lines. FIGS. 3A to 3E are cross-sectional diagrams of FIGS. 1A to 1E taken along III-III' cross-sectional lines and IV-IV' cross-sectional lines. In the top-view diagrams of the embodiment, some elements in the cross-sectional diagrams are omitted to clearly describe a positional relationship between each of the elements in the top-view diagrams.

Figure 2A:
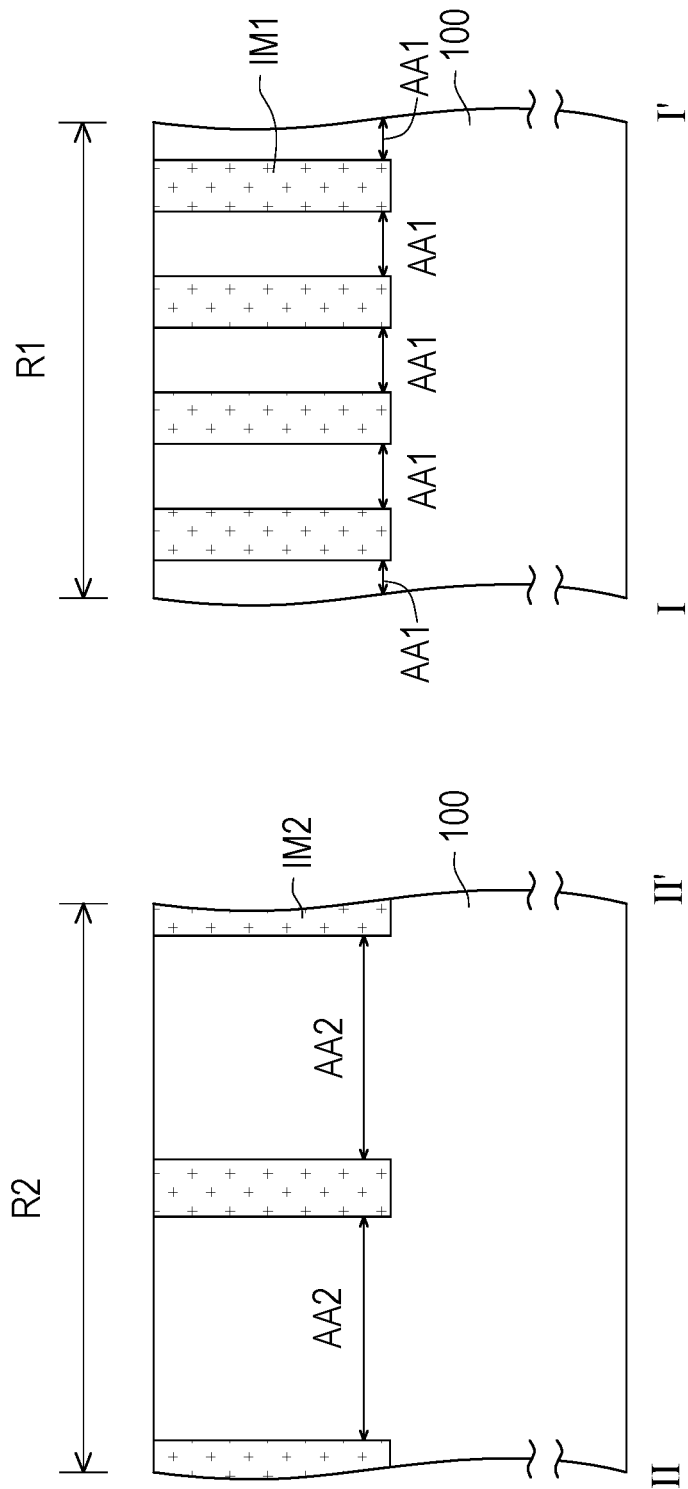
FIGS. 2A to 2E are cross-sectional diagrams of FIGS. 1A to 1E taken along I-I' cross-sectional lines and II-II' cross-sectional lines.
Figure 3A:
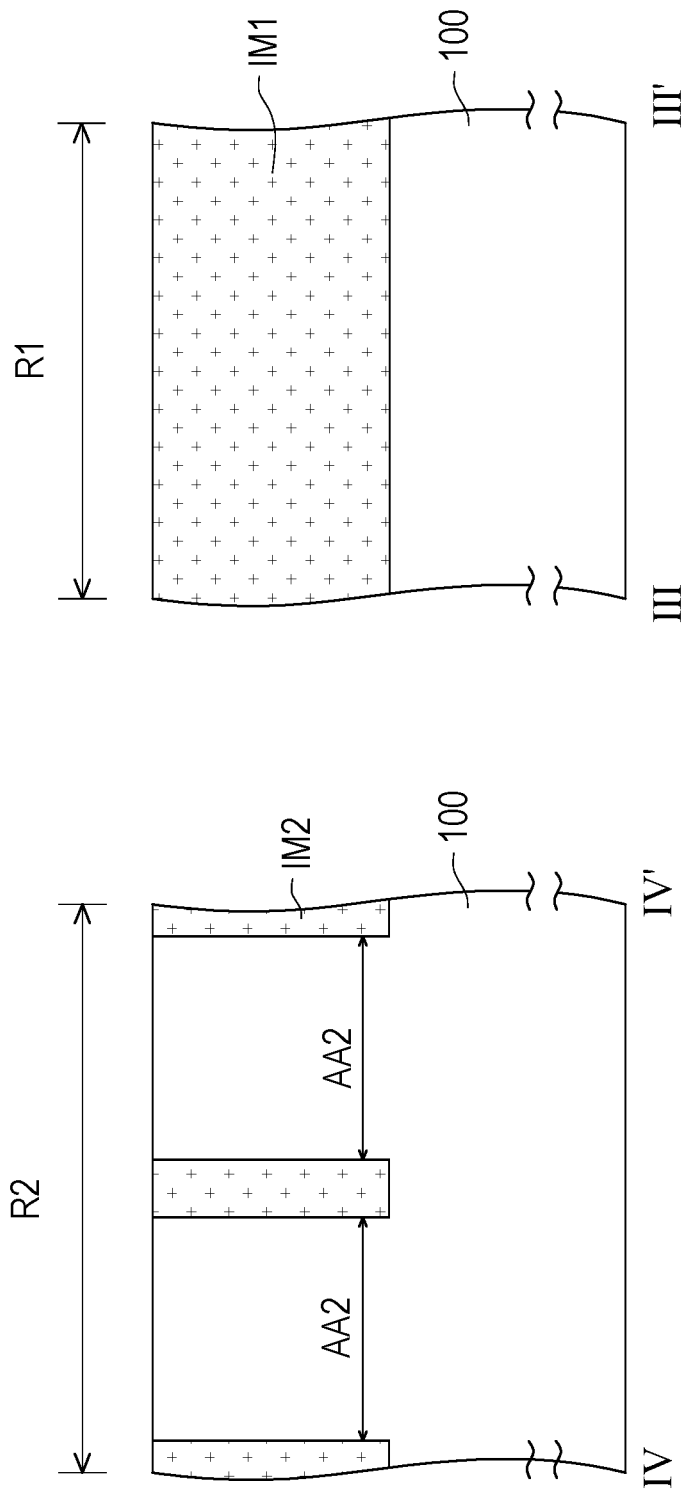
FIGS. 3A to 3E are cross-sectional diagrams of FIGS. 1A to 1E taken along III-III' cross-sectional lines and IV-IV' cross-sectional lines.

Referring to FIG. 1A, FIG. 2A and FIG. 3A, a substrate 100 is provided. The substrate 100 includes a capacitor region R1. In some embodiments, the capacitor region R1 is a metal-insulator-semiconductor (MIS) capacitor region. In some embodiments, the substrate 100 further includes a memory cell region R2. In some embodiments, the memory cell region R2 is a DRAM cell region. The substrate 100 is, for example, a semiconductor substrate, such as a silicon substrate. In some embodiments, the substrate 100 is a P-type substrate or an N-type substrate.

Next, an isolation material layer IM1 is formed in the substrate 100 in the capacitor region R1, and an isolation material layer IM2 is formed in the substrate 100 in the memory cell region R2. In some embodiments, the isolation material layer IM1 defines an active region AA1 in the substrate 100 in the capacitor region R1. In some embodiments, the isolation material layer IM2 defines an active region AA2 in the substrate 100 in the memory cell region R2. The material of the isolation material layer IM1 and that of the isolation material layer IM2 are, for example, a silicon oxide. In some embodiments, the formation method of the isolation material layer IM1 and the isolation material layer IM2 includes performing a shallow trench isolation structure manufacturing process.

Figure 1B:
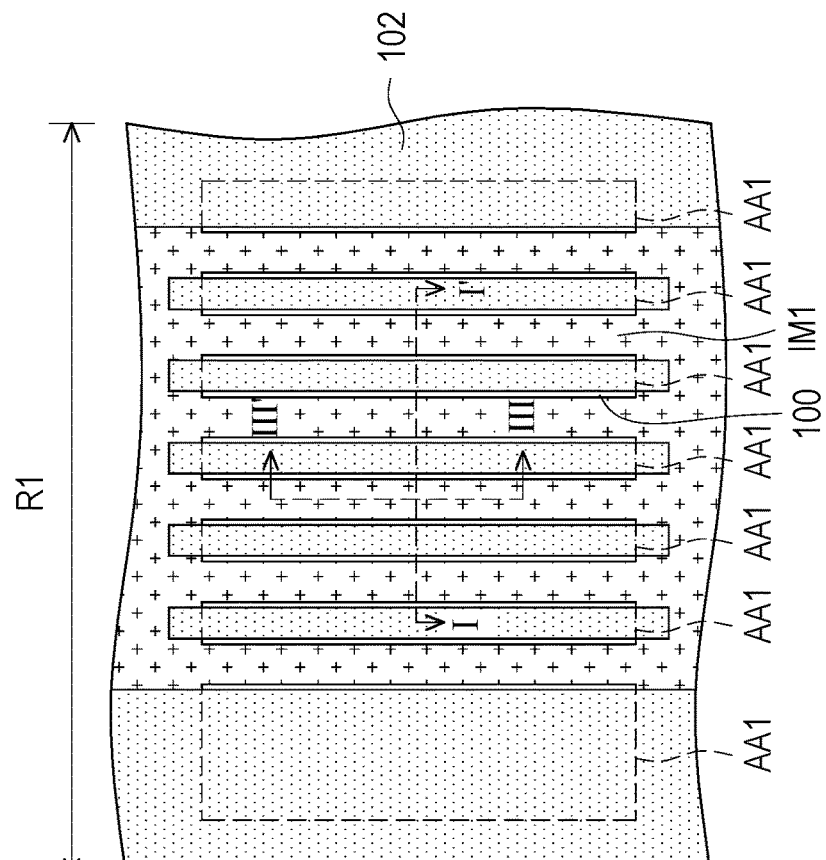
Figure 1B:
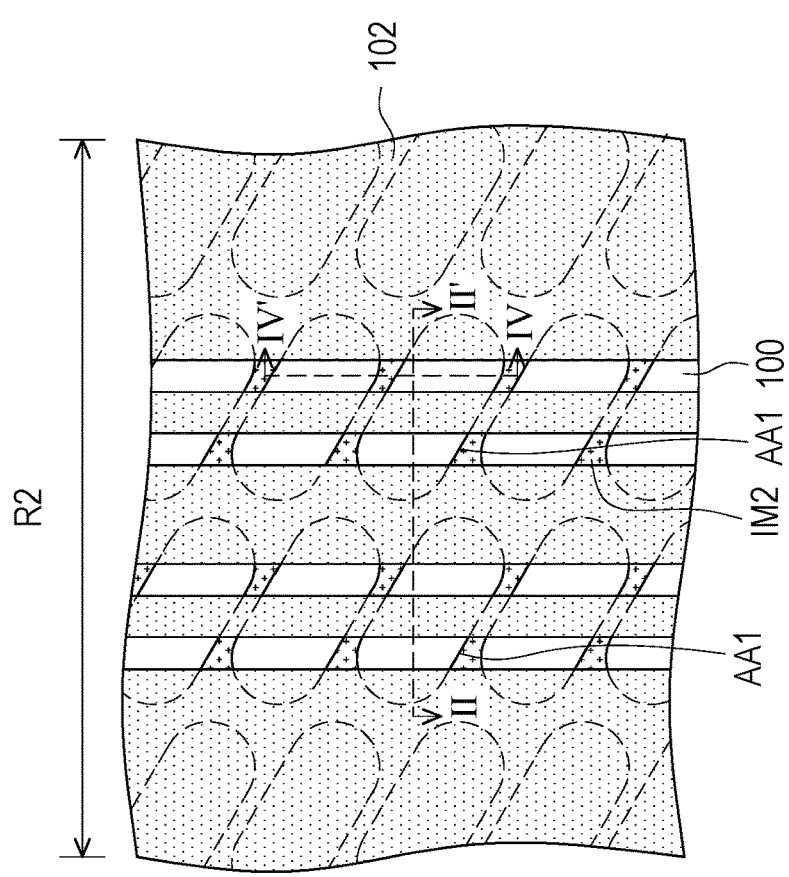
Figure 2B:
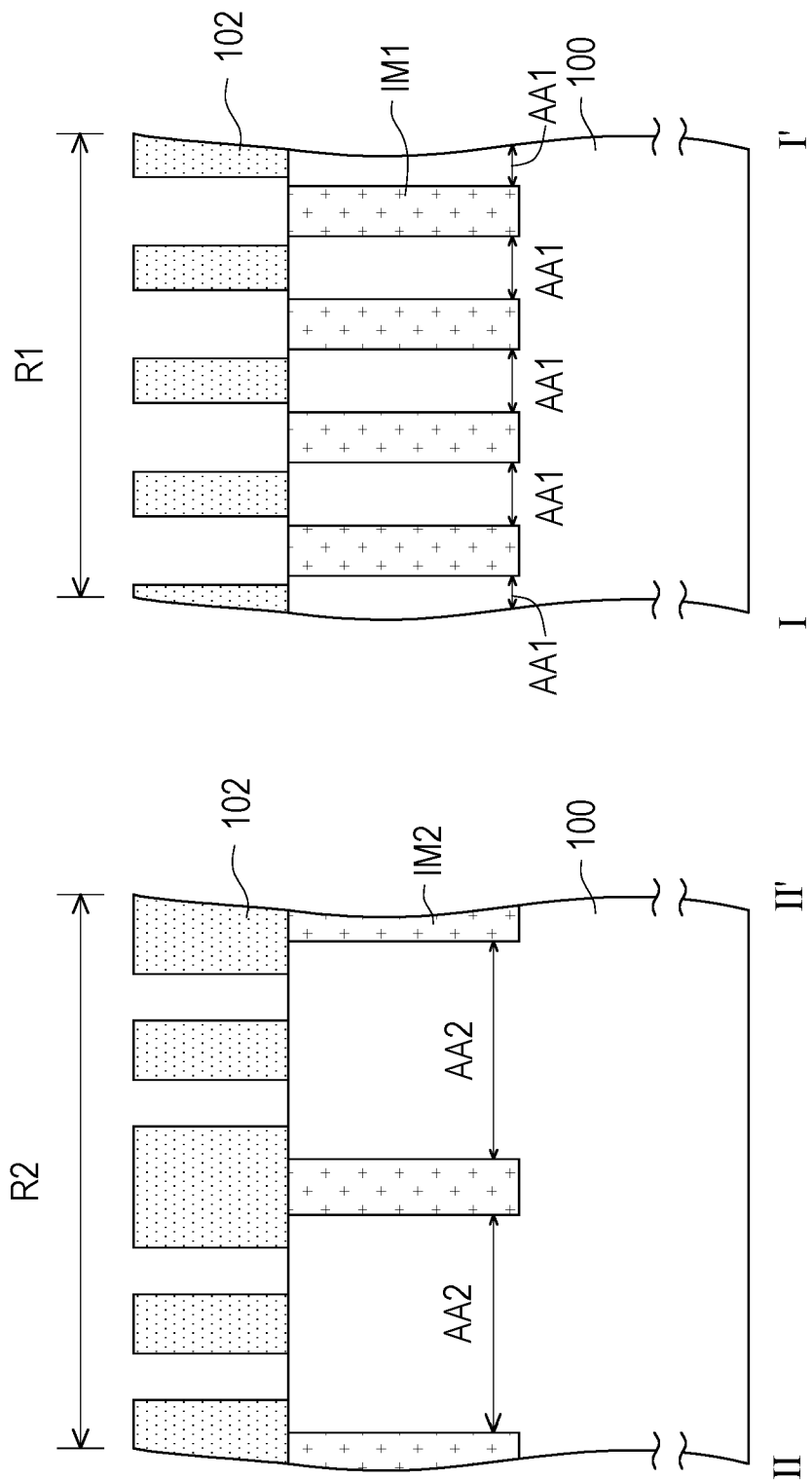
Figure 3B:
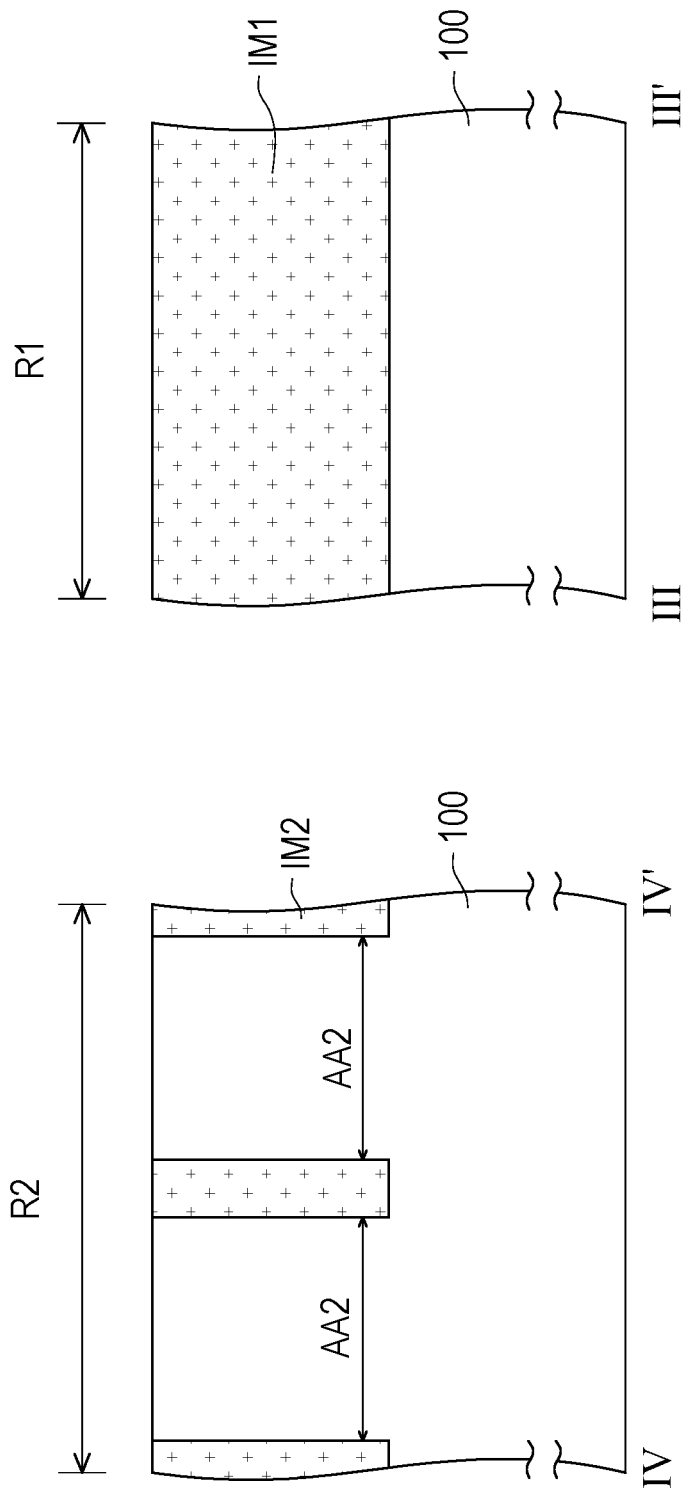

Referring to FIG. 1B, FIG. 2B and FIG. 3B, a patterned photoresist layer 102 is formed on a substrate 100. In some embodiments, the patterned photoresist layer 102 exposes a part of an isolation material layer IM1. Additionally, the patterned photoresist layer 102 exposes a part of the substrate 100 and a part of an isolation material layer IM2 in a memory cell region R2. In some embodiments, as shown in FIG. 2B, the patterned photoresist layer 102 further exposes the part of the substrate 100 in a capacitor region R1. In some embodiments, the patterned photoresist layer 102 is formed by a lithography process.

Figure 1C:
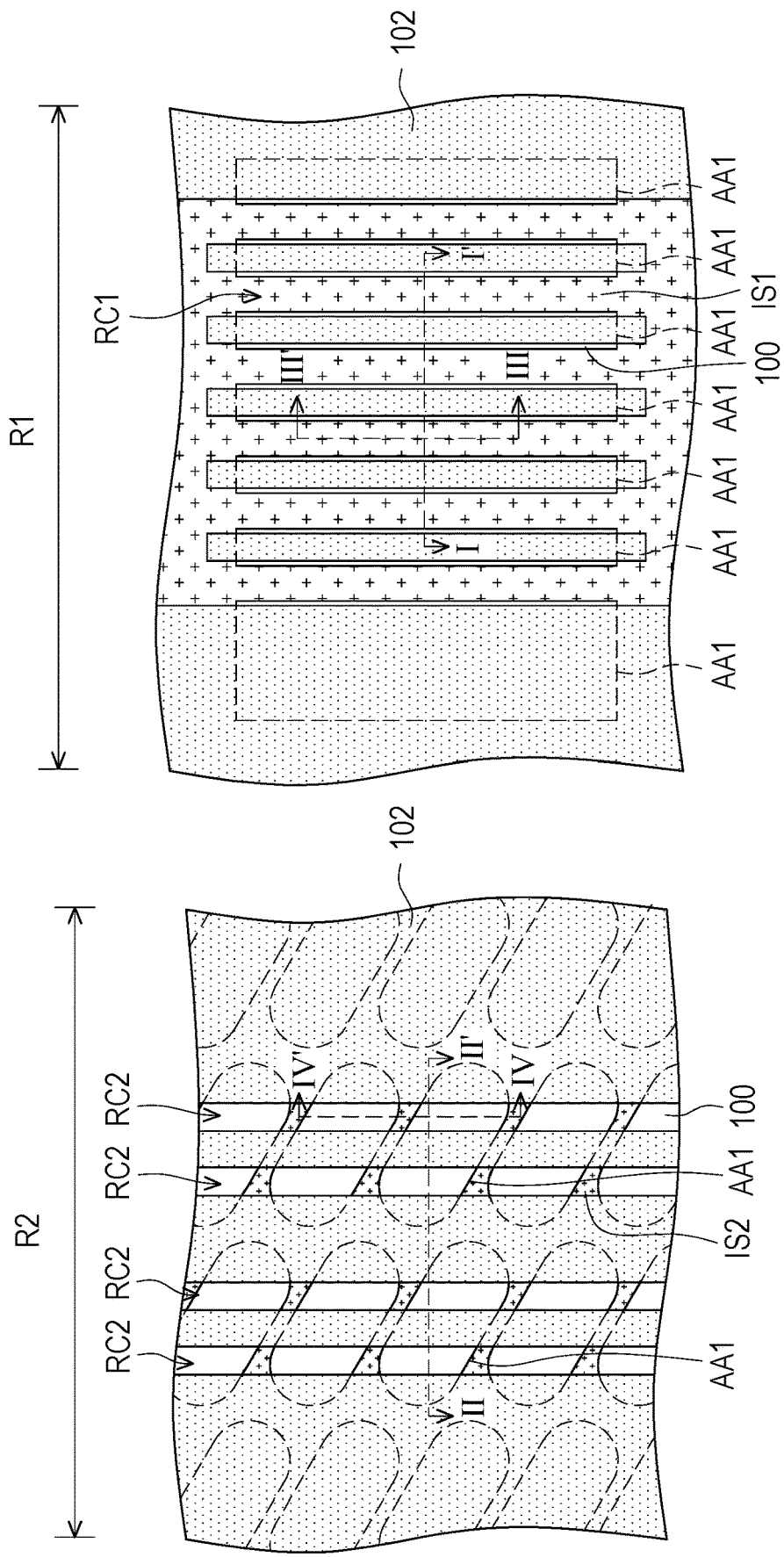
Figure 2C:
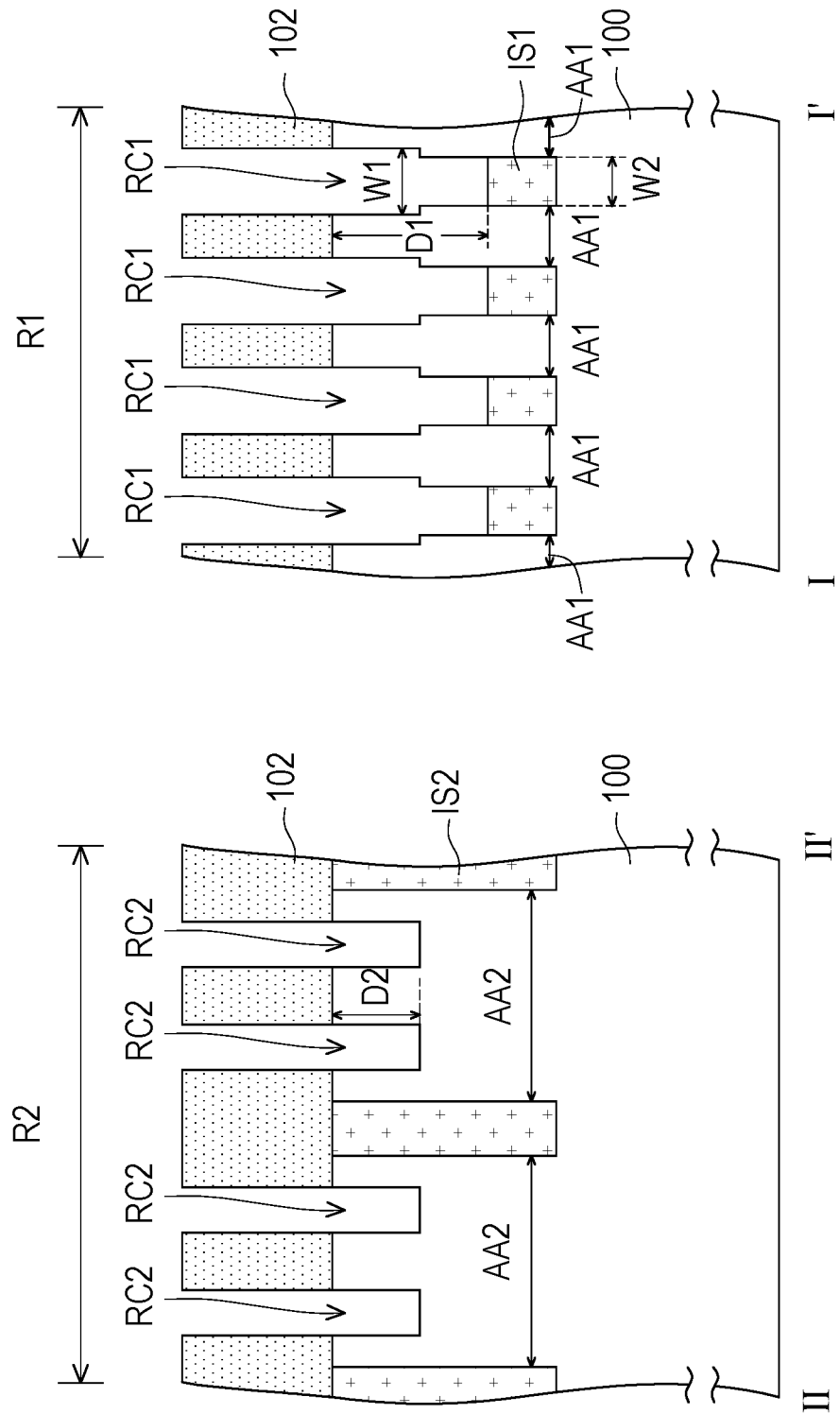
Figure 3C:
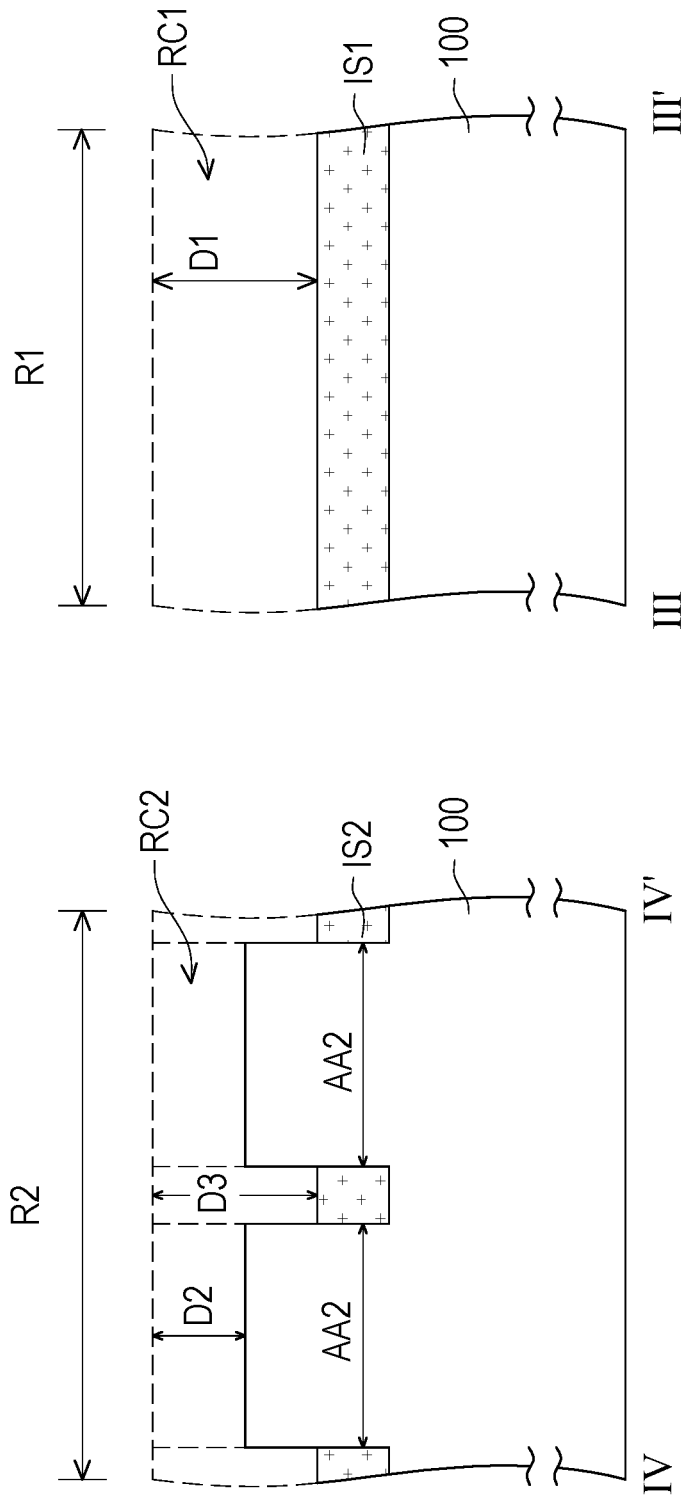

Referring to FIG. 1C, FIG. 2C and FIG. 3C, using a patterned photoresist layer 102 as a mask, a dry etching manufacturing process is performed on an isolation material layer IM1, an isolation material layer IM2 and a substrate 100 in a memory cell region R2. Through the above etching manufacturing process, a part of the isolation material layer IM1 is removed, and an isolation structure IS1 and a groove RC1 are formed in the substrate 100 in a capacitor region R1. The isolation structure IS1 defines an active region AA1 in the substrate 100 in the capacitor region R1. The groove RC1 is located directly above the isolation structure IS1. In addition, through the above etching manufacturing process, a part of the isolation material layer IM2 and a part of the substrate 100 in the memory cell region R2 are removed, and an isolation structure IS2 and a groove RC2 are formed in the substrate 100 in the memory cell region R2. The isolation structure IS2 defines an active region AA2 in the substrate 100 in the memory cell region R2. The groove RC2 extends over a part of the active region AA2 and a part of the isolation structure IS2.

In some embodiments, in the above dry etching manufacturing process, an etching rate of materials (e.g., silicon oxide) of the isolation material layer IM1 is greater than an etching rate of materials (e.g., silicon) of the substrate 100 in the memory cell region R2, so that a depth D1 of the groove RC1 is greater than a depth D2 of the groove RC2 located directly above the active region AA2.

In some embodiments, in the above dry etching manufacturing process, an etching rate of materials (e.g., silicon oxide) of the isolation material layer IM2 is higher than an etching rate of materials (e.g., silicon) of the substrate 100 in the memory cell region R2, and a depth D3 of the groove RC2 located directly above the isolation structure IS2 is greater than the depth D2 of the groove RC2 located directly above the active region AA2.

In some embodiments, in the manufacturing process of removing the part of the isolation material layer IM1, the part of the substrate 100 in the capacitor region R1 is removed, so that a width W1 of the groove RC1 is greater than a width W2 of the isolation structure IS1 (FIG. 2C), but the disclosure is not limited hereto. In other embodiments, the width W1 of the groove RC1 is equal to the width W2 of the isolation structure IS1.

Figure 1D:
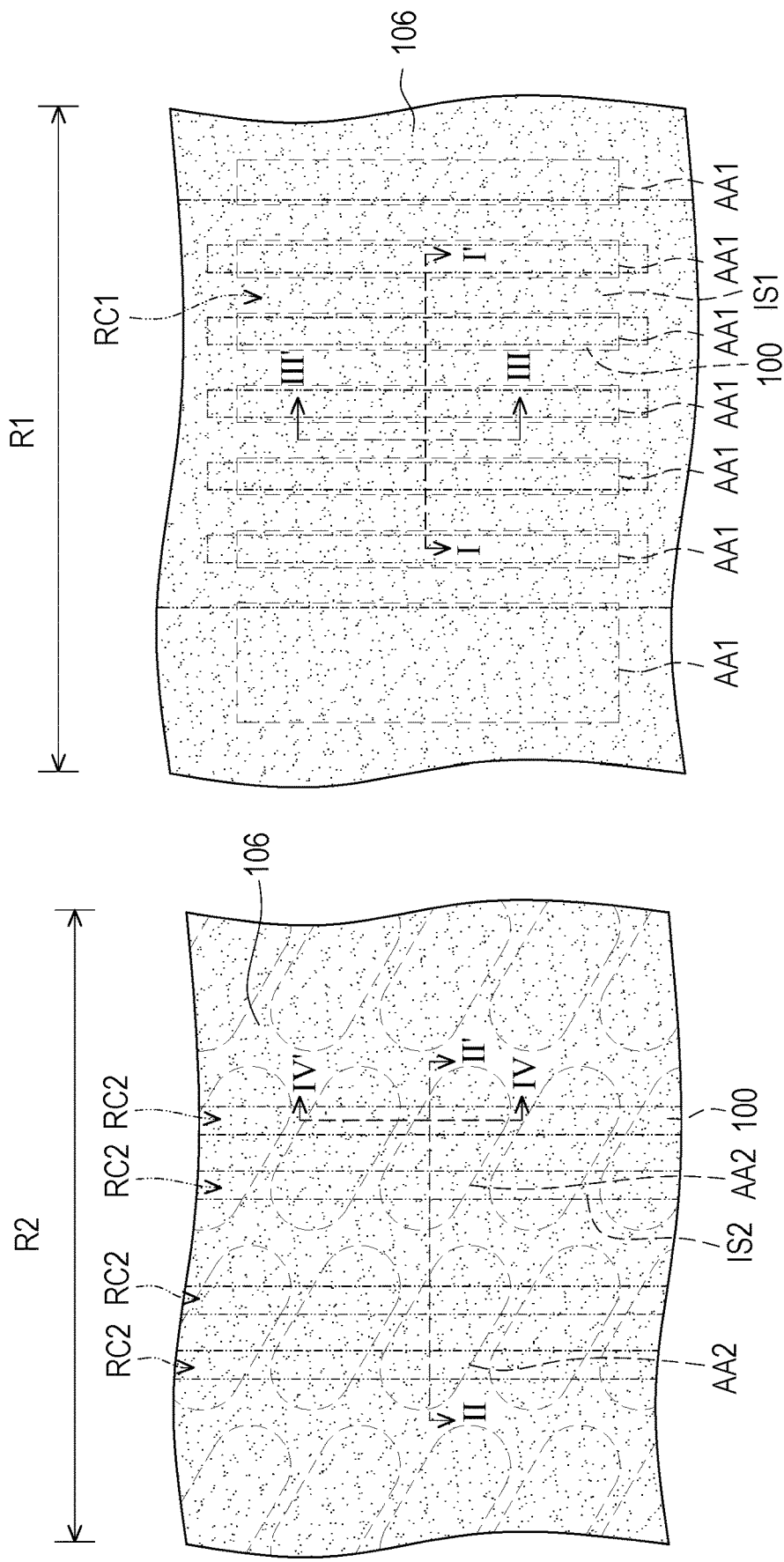
Figure 2D:
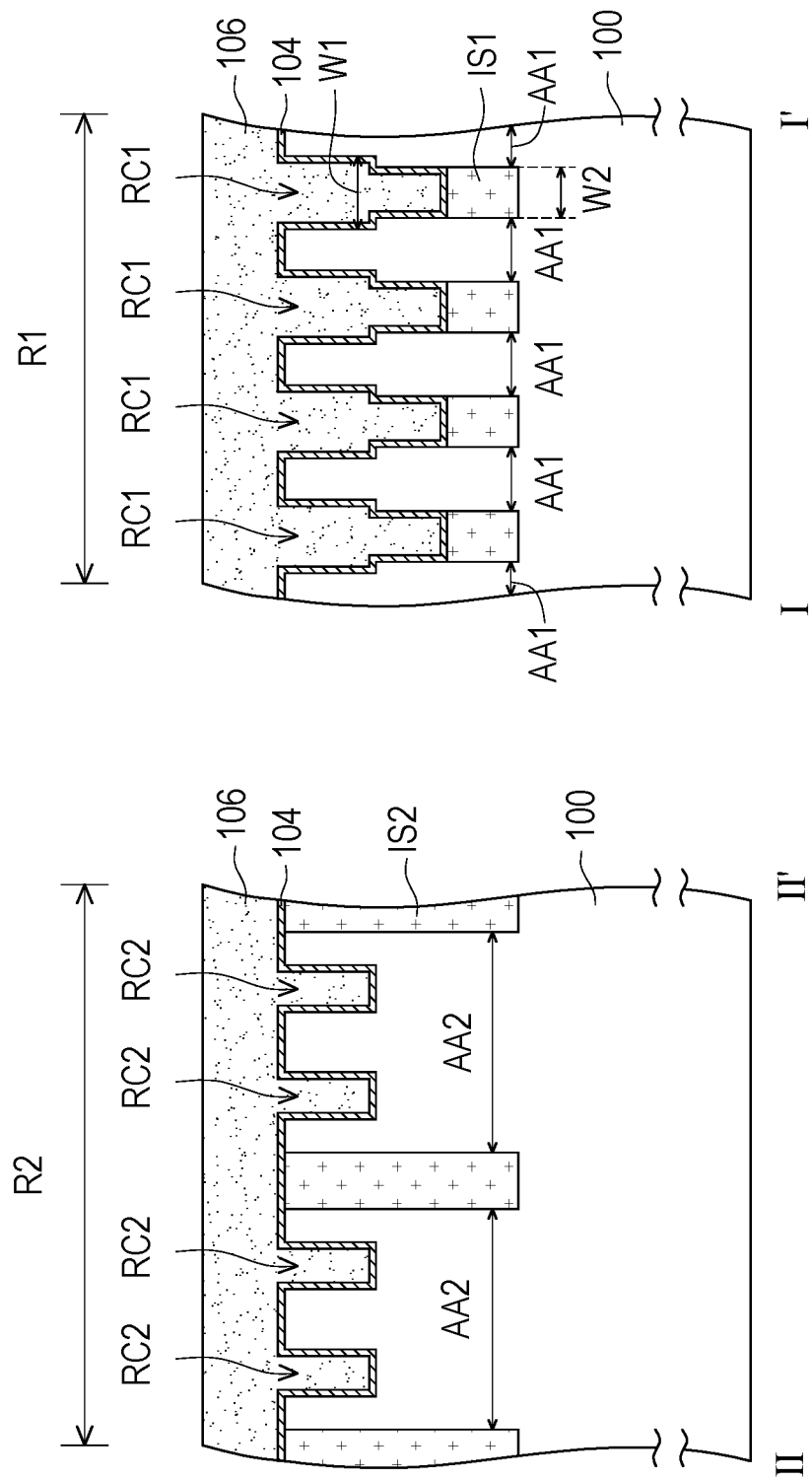
Figure 3D:
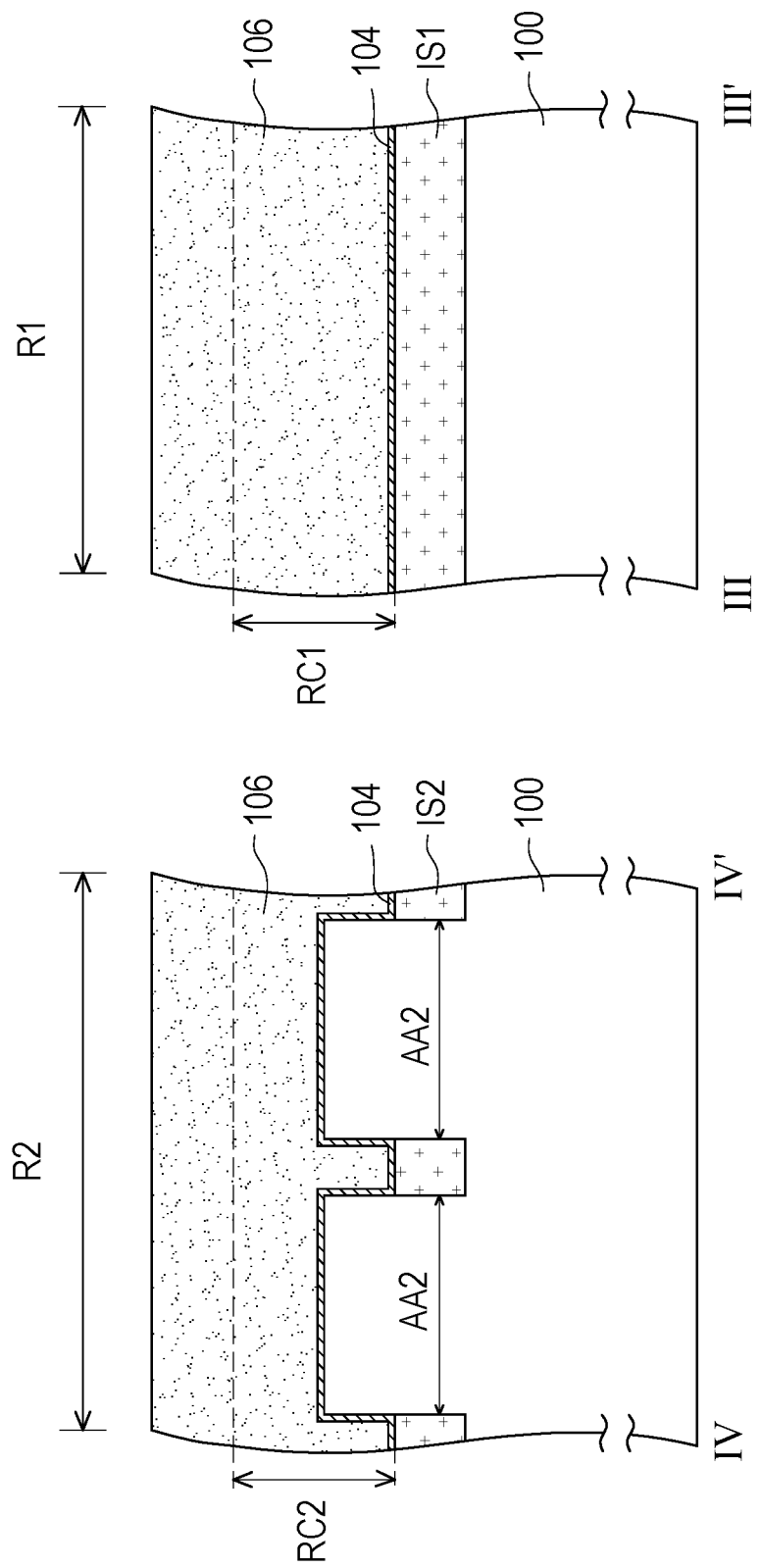

Referring to FIG. 1D, FIG. 2D and FIG. 3D, a patterned photoresist layer 102 is removed. In some embodiments, the removal method of the patterned photoresist layer 102 is, for example, dry stripping or wet stripping.

Next, a dielectric material layer 104 is formed on a substrate 100, an isolation structure IS1, an isolation structure IS2, a surface of a groove RC1 and a surface of a groove RC2. In some embodiments, the dielectric material layer 104 is conformally formed on the substrate 100, the isolation structure IS1, the isolation structure IS2, the surface of the groove RC1 and the surface of the groove RC2. A material of the dielectric material layer 104 is, for example, a silicon oxide. The formation method of the dielectric material layer 104 is, for example, a chemical vapor deposition (CVD) method.

Then, a conductive material layer 106 is formed on the dielectric material layer 104. The conductive material layer 106 fills the groove RC1 and the groove RC2. In some embodiments, a material of the conductive material layer 106 is a metal, for example, a tungsten. In some embodiments, the formation method of the conductive material layer 106 is, for example, a CVD method.

Figure 1E:
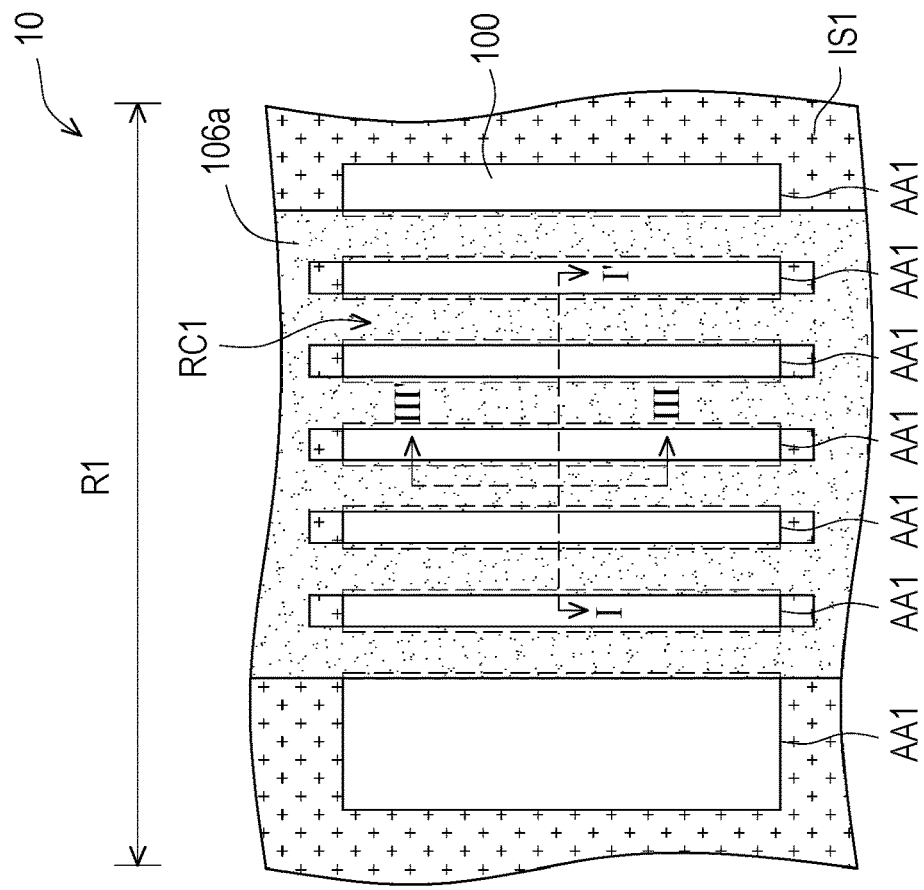
Figure 1E:
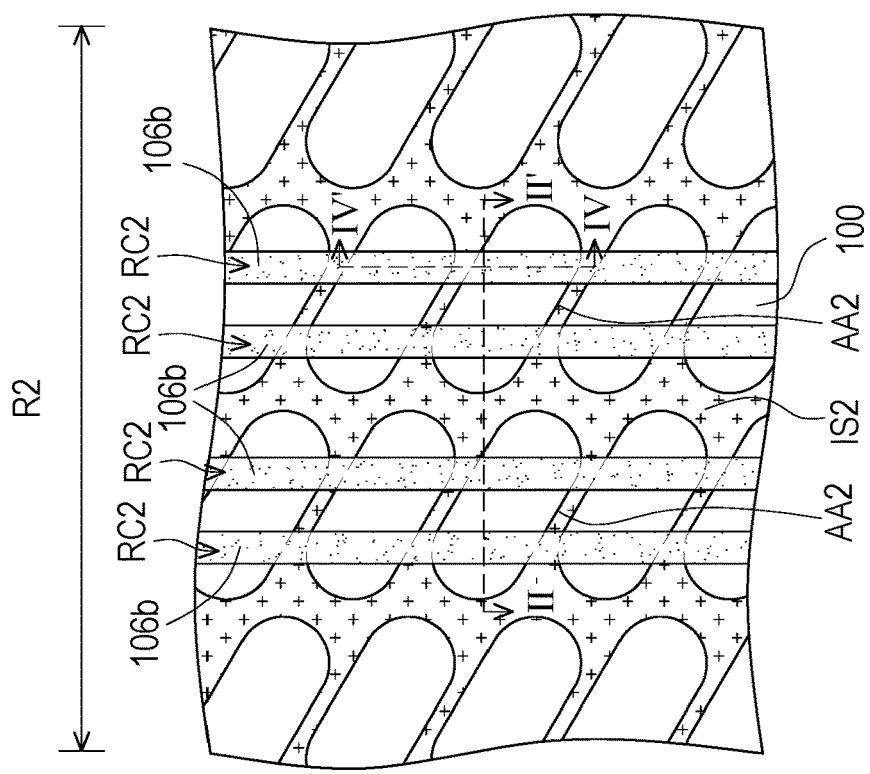
Figure 2E:
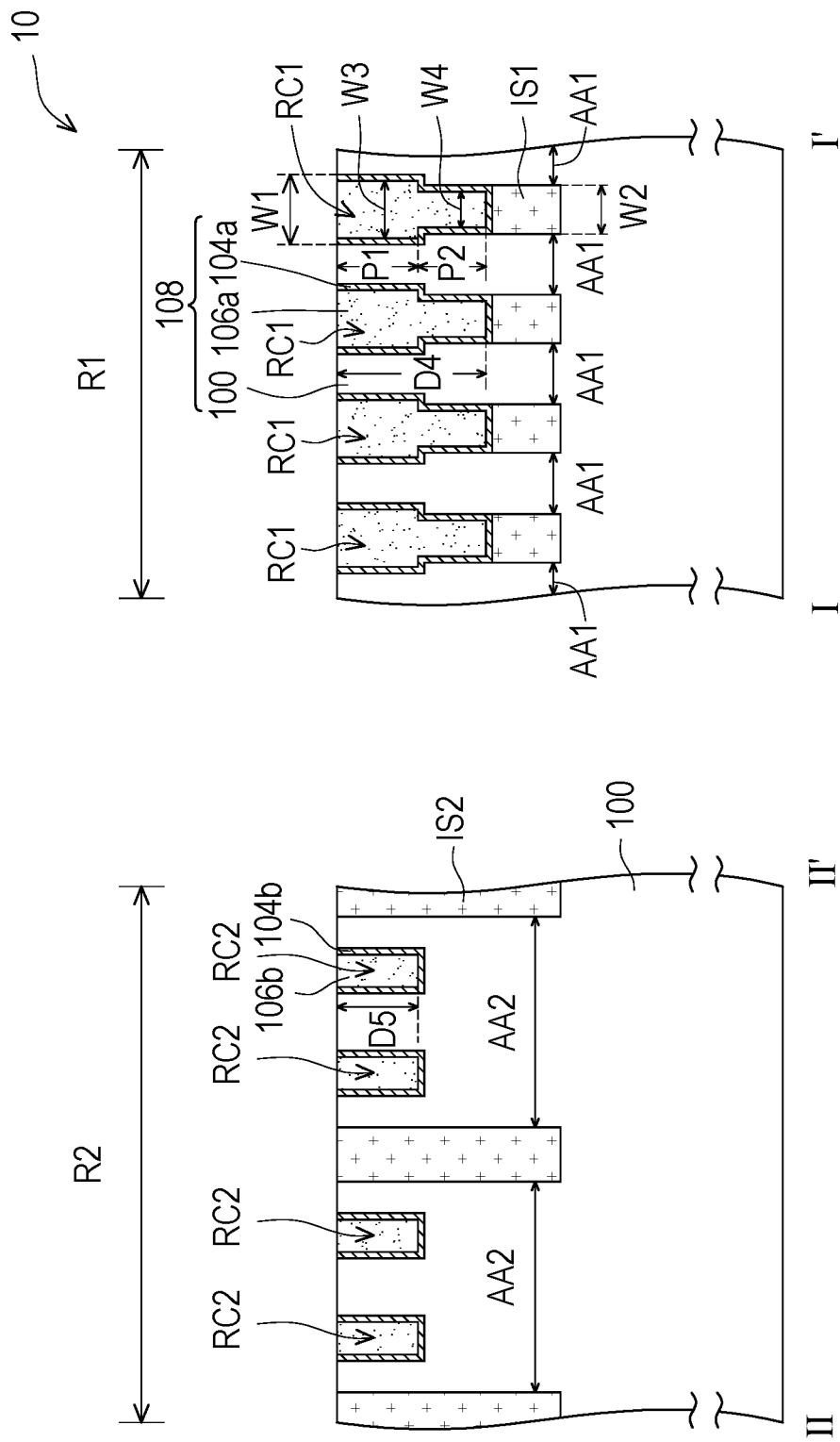
Figure 3E:
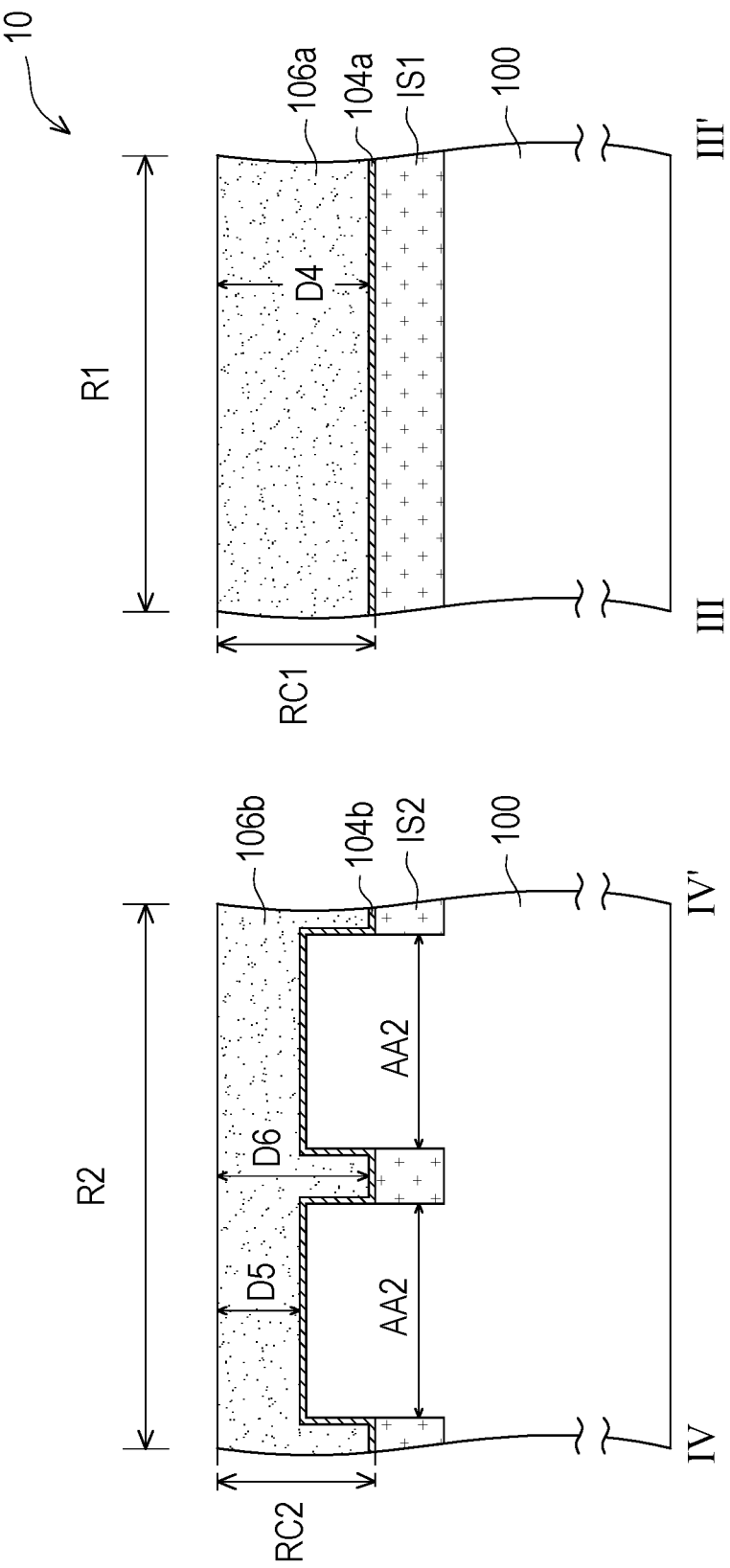

Referring to FIG. 1E, FIG. 2E and FIG. 3E, a conductive material layer 106 and a dielectric material layer 104 located outside a groove RC1 and outside a groove RC2 are removed to form an electrode layer 106a, a gate electrode 106b, a dielectric layer 104a and a dielectric layer 104b. In some embodiments, the removal method of the conductive material layer 106 and the dielectric material layer 104 located outside the groove RC1 and outside the groove RC2 is, for example, a chemical mechanical polishing (CMP) method.

Through the above method, a capacitor 108 can be formed a capacitor region R1 (FIG. 2E). The capacitor 108 includes a substrate 100 in the capacitor region R1, the electrode layer 106a and the dielectric layer 104a. In some embodiments, the capacitor 108 is a MIS capacitor. In some embodiments, the substrate 100 in the capacitor region R1 is used as another electrode layer in the capacitor 108.

The electrode layer 106a is disposed in the substrate 100 in the capacitor region R1. In some embodiments, the electrode layer 106a functions as a recess gate electrode or a buried gate electrode. In some embodiments, as shown in FIG. 2E, the electrode layer 106a includes an upper part P1 and a lower part P2 connected to each other. A width W3 of the upper part P1 is greater than a width W4 of the lower part P2, but the disclosure is not limited hereto. In other embodiments, the electrode layer 106a has a uniform width. In some embodiments, as shown in FIG. 2E, the cross-sectional shape of the electrode layer 106a includes a T-shape. In some embodiments, as shown in FIG. 1E, the top-view shape of the electrode layer 106a includes a grid shape. A material of the electrode layer 106a is a metal, for example, a tungsten.

The dielectric layer 104a is disposed between the electrode layer 106a and the substrate 100 and between the electrode layer 106a and an isolation structure IS1. The dielectric layer 104a is in direct contact with the isolation structure IS1. In addition, the dielectric layer 104a is in direct contact with the electrode layer 106a. Moreover, the dielectric layer 104a is in direct contact with the substrate 100 in the capacitor region R1. A material of the dielectric layer 104a is, for example, a silicon oxide.

In some embodiments, a groove RC1 is formed in the substrate 100 in the capacitor region R1. The electrode layer 106a and the dielectric layer 104a are disposed in the groove RC1. As shown in FIG. 2E, a width W1 of the groove RC1 is greater than or equal to a width W2 of the isolation structure IS1. In this embodiment, it is taken as an example that the width W1 of the groove RC1 is greater than the width W2 of the isolation structure IS1, but the disclosure is not limited hereto. In other embodiments, the width W1 of the groove RC1 is equal to the width W2 of the isolation structure IS1.

In some embodiments, the gate electrode 106b is formed in the substrate 100 in a memory cell region R2 through the above method. In some embodiments, the electrode layer 106a and the gate electrode 106b are formed simultaneously through the above method. In some embodiments, the gate electrode 106b extends over a part of an active region AA2 and a part of an isolation structure IS2. In some embodiments, as shown in FIGS. 2E and 3E, a depth D4 of the electrode layer 106a is greater than a depth D5 of the gate electrode 106b located directly above the active region AA2. In some embodiments, as shown in FIGS. 2E and 3E, a depth D6 of the gate electrode 106b located directly above the isolation structure IS2 is greater than the depth D5 of the gate electrode 106b located directly above the active region AA2. A material of the gate electrode 106b is metal, for example, a tungsten.

In some embodiments, the dielectric layer 104b is formed between the gate electrode 106b and the substrate 100 and between the gate electrode 106b and the isolation structure IS2 through the above method. In some embodiments, the dielectric layer 104a and the dielectric layer 104b are formed simultaneously through the above method. The dielectric layer 104b is in direct contact with the isolation structure IS2. In addition, the dielectric layer 104b is in direct contact with the gate electrode 106b. Moreover, the dielectric layer 104b is indirect contact with the substrate 100 in the memory cell region R2. A material of the dielectric layer 104b is, for example, a silicon oxide.

In some embodiments, the groove RC2 is provided in the substrate 100 in the memory cell region R2. The gate electrode 106b and the dielectric layer 104b are disposed in the groove RC2.

After the above-mentioned structure is formed, manufacturing processes as required are further performed to complete the manufacturing of a memory component in the memory cell region R2 (e.g., DRAM components). Since subsequent manufacturing processes for forming memory components (e.g., DRAM components) are well known to those skilled in the art, descriptions thereof will be omitted here.

Hereinafter, a semiconductor structure 10 of the embodiment will be described with reference to FIG. 1E, FIG. 2E and FIG. 3E. In addition, although the formation method of the semiconductor structure 10 is described by taking the above-mentioned methods as examples, the disclosure is not limited hereto.

Referring to FIG. 1E, FIG. 2E and FIG. 3E, a semiconductor structure 10 includes a substrate 100, an isolation structure IS1 and a capacitor 108. The substrate 100 includes a capacitor region R1. The isolation structure IS1 is disposed in the substrate 100 in the capacitor region R1. The capacitor 108 is located in the capacitor region R1. The capacitor 108 includes substrate 100 in the capacitor region R1, an electrode layer 106a and a dielectric layer 104a. The electrode layer 106a is disposed in the substrate 100 in the capacitor region R1. The dielectric layer 104a is disposed between the electrode layer 106a and the substrate 100 and between the electrode layer 106a and the isolation structure IS1. The dielectric layer 104a is in direct contact with the isolation structure IS1.

In some embodiments, the substrate 100 further includes a memory cell region R2. In some embodiments, the semiconductor structure 10 further includes an isolation structure IS2, a gate electrode 106b and a dielectric layer 104b. The isolation structure IS2 is disposed in the substrate 100 in the memory cell region R2. The gate electrode 106b is disposed in the substrate 100 in the memory cell region R2. The dielectric layer 104b is disposed between the gate electrode 106b and the substrate 100 and between the gate electrode 106b and the isolation structure IS2. The dielectric layer 104b is in direct contact with the isolation structure IS2.

In addition, details of the elements (e.g., materials, formation methods and effects) in the semiconductor structure 10 have been described in details in the above-mentioned embodiments, so will not be repeated here.

Based on the above-mentioned embodiments, it can be known that in the semiconductor structure 10 and the manufacturing method thereof, the electrode layer 106a and the isolation structure IS1 are disposed in the substrate 100 in the capacitor region R1. The dielectric layer 104a is disposed between the electrode layer 106a and the substrate 100 and between the electrode layer 106a and the isolation structure IS1, and the dielectric layer 104a is in direct contact with the isolation structure IS1. Therefore, compared with conventional electrode layers, the electrode layer 106a of the capacitor 108 has a greater depth, which increases an area of the electrode layer 106a. Since the electrode layer 106a of the capacitor 108 has a greater area, a capacitance value per unit area of the capacitor 108 is effectively increased. On the other hand, in the manufacturing method of the semiconductor structure 10, the manufacturing process of the capacitor 108 can be integrated with that of other semiconductor devices (e.g., DRAM components in the memory cell region R2). In addition, since the manufacturing process of the capacitor 108 can be integrated with that of the other semiconductor devices (e.g., DRAM components in the memory cell region R2), an additional mask is not required without incurring further manufacturing costs.

To sum up, in the semiconductor structure and the manufacturing method thereof of the above-mentioned embodiments, compared with conventional electrode layers, the electrode layer of the capacitor of the above-mentioned embodiments has a greater depth, thereby effectively increasing the area of the electrode layer and the capacitance value per unit area of the capacitor. On the other hand, the manufacturing method of the semiconductor structure of the above-mentioned embodiments can be integrated with the manufacturing process of the other semiconductor devices. In addition, since the manufacturing process of the capacitor of the above-mentioned embodiments can be integrated with that of the other semiconductor devices (e.g., DRAM components), an additional mask is not required without incurring further manufacturing costs.

Although the disclosure has been disclosed with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. A semiconductor structure, comprising:
a substrate comprising a capacitor region;
a first isolation structure disposed in the substrate in the capacitor region; and
a capacitor, located in the capacitor region, and comprising:
the substrate in the capacitor region;
an electrode layer disposed in the substrate in the capacitor region; and
a first dielectric layer disposed between the electrode layer and the substrate and between the electrode layer and the first isolation structure, wherein the first dielectric layer is in direct contact with the first isolation structure,
wherein the substrate further comprises a memory cell region, and the semiconductor structure further comprises:
a second isolation structure disposed in the substrate in the memory cell region;
a gate electrode disposed in the substrate in the memory cell region; and
a second dielectric layer disposed between the gate electrode and the substrate and between the gate electrode and the second isolation structure, wherein the second dielectric layer is in direct contact with the second isolation structure.

2. The semiconductor structure according to claim 1, wherein a groove is formed in the substrate in the capacitor region, and the electrode layer and the first dielectric layer are disposed in the groove.

3. The semiconductor structure according to claim 2, wherein a width of the groove is greater than or equal to a width of the first isolation structure.

4. The semiconductor structure according to claim 1, wherein the electrode layer comprises an upper part and a lower part connected to each other, and a width of the upper part is greater than a width of the lower part.

5. The semiconductor structure according to claim 1, wherein a cross-sectional shape of the electrode layer comprises a T-shape.

6. The semiconductor structure according to claim 1, wherein a top-view shape of the electrode layer comprises a grid shape.

7. The semiconductor structure according to claim 1, wherein the second isolation structure defines an active region in the substrate in the memory cell region.

8. The semiconductor structure according to claim 7, wherein the gate electrode extends over a part of the active region and a part of the second isolation structure.

9. The semiconductor structure according to claim 8, wherein a depth of the electrode layer is greater than a depth of the gate electrode located directly above the active region.

10. The semiconductor structure according to claim 8, wherein a depth of the gate electrode located directly above the second isolation structure is greater than a depth of the gate electrode located directly above the active region.

11. A manufacturing method of a semiconductor structure, comprising:
providing a substrate, wherein the substrate comprises a capacitor region;
forming a first isolation structure in the substrate in the capacitor region; and
forming a capacitor in the capacitor region, wherein the capacitor comprises:
the substrate in the capacitor region;
an electrode layer disposed in the substrate in the capacitor region; and
a first dielectric layer disposed between the electrode layer and the substrate and between the electrode layer and the first isolation structure, wherein the first dielectric layer is in direct contact with the first isolation structure,
wherein the substrate further comprises a memory cell region, and the manufacturing method of the semiconductor structure further comprises:
forming a second isolation structure in the substrate in the memory cell region;
forming a gate electrode in the substrate in the memory cell region; and
forming a second dielectric layer between the gate electrode and the substrate and between the gate electrode and the second isolation structure, wherein the second dielectric layer is in direct contact with the second isolation structure.

12. The manufacturing method of the semiconductor structure according to claim 11, wherein the electrode layer and the gate electrode are formed simultaneously.

13. The manufacturing method of the semiconductor structure according to claim 11, wherein a formation method of the electrode layer, the gate electrode, the first dielectric layer and the second dielectric layer comprises:
forming a first isolation material layer in the substrate in the capacitor region, and forming a second isolation material layer in the substrate in the memory cell region;
removing a part of the first isolation material layer, and forming the first isolation structure and a first groove in the substrate in the capacitor region, wherein the first groove is located directly above the first isolation structure;
removing a part of the second isolation material layer and a part of the substrate in the memory cell region, and forming the second isolation structure and a second groove in the substrate in the memory cell region, wherein the second isolation structure defines an active region in the substrate in the memory cell region, and the second groove extends over a part of the active region and a part of the second isolation structure;
forming a dielectric material layer on the substrate, the first isolation structure, the second isolation structure, a surface of the first groove and a surface of the second groove;
forming a conductive material layer on the dielectric material layer, wherein the conductive material layer fills the first groove and the second groove; and
removing the conductive material layer and the dielectric material layer located outside the first groove and outside the second groove to form the electrode layer, the gate electrode, the first dielectric layer and the second dielectric layer.

14. The manufacturing method of the semiconductor structure according to claim 13, wherein a formation method of the first isolation material layer and the second isolation material layer comprises performing a shallow trench isolation structure manufacturing process.

15. The manufacturing method of the semiconductor structure according to claim 13, wherein a formation method of the first groove and the second groove comprises:
forming a patterned photoresist layer on the substrate, wherein the patterned photoresist layer exposes the part of the first isolation material layer, and the patterned photoresist layer exposes the part of the substrate in the memory cell region and the part of the second isolation material layer; and performing a dry etching manufacturing process on the first isolation material layer, the second isolation material layer and the substrate in the memory cell region using the patterned photoresist layer as a mask.

16. The manufacturing method of the semiconductor structure according to claim 15, wherein, in the dry etching manufacturing process, an etching rate of a material of the first isolation material layer is greater than an etching rate of a material of the substrate in the memory cell region, so that a depth of the first groove is greater than a depth of the second groove located directly above the active region.

17. The manufacturing method of the semiconductor structure according to claim 15, wherein in the dry etching manufacturing process, an etching rate of a material of the second isolation material layer is greater than an etching rate of a material of the substrate in the memory cell region, so that a depth of the second groove located directly above the second isolation structure is greater than a depth of the second groove located directly above the active region.

18. The manufacturing method of the semiconductor structure according to claim 13, further comprising:

removing a part of the substrate in the capacitor region in a process of removing the part of the first isolation material layer, so that a width of the first groove is greater than a width of the first isolation structure.

* * * * *